United States Patent [19]
Gao et al.

[11] Patent Number: 5,180,707
[45] Date of Patent: Jan. 19, 1993

[54] METHOD FOR SYNTHESIS OF HIGH $T_c$ SUPERCONDUCTING MATERIALS BY OXIDATION AND PRESS COATING OF METALLIC PRECURSOR ALLOYS

[75] Inventors: Wei Gao, Somerville; John B. Vander Sande, Newbury, both of Mass.

[73] Assignee: Massachusetts Institute of Technology, Cambridge, Mass.

[21] Appl. No.: 652,528

[22] Filed: Feb. 8, 1991

[51] Int. Cl.$^5$ .......................... B05D 5/12; B05D 3/12
[52] U.S. Cl. ......................... 505/1; 505/736; 505/733; 427/62; 427/356; 427/369; 427/370; 428/469
[58] Field of Search ................. 505/1, 733, 734, 736; 427/62, 63, 356, 369, 370; 428/469; 156/303.1, 308.2

[56] References Cited

U.S. PATENT DOCUMENTS

| 3,733,692 | 5/1973 | Fietz et al. | 29/599 |
| 4,826,808 | 5/1989 | Yurek et al. | 505/1 |
| 5,015,318 | 5/1991 | Smits et al. | 156/233 |

FOREIGN PATENT DOCUMENTS

| 8817530 | 1/1989 | Australia . |
| 87101048 | 12/1988 | Canada . |
| 0295023 | 6/1988 | European Pat. Off. . |
| 3316275 | 5/1989 | European Pat. Off. . |
| 63-285816 | 11/1988 | Japan . |
| 63-291857 | 11/1988 | Japan . |
| 1-097312 | 4/1989 | Japan . |
| 1-286920 | 11/1989 | Japan . |

OTHER PUBLICATIONS

Spann et al., "Oriented BSCCO thick film coatings on polycrystalline MgO", J. Mater. Res., vol. 5, No. 6, Jun. 1990 pp. 1163-1168.
Nasu et al., "Preparation of mostly single high-$T_c$ phase thin films in Bi, Pb-Sr-Ca-Cu-O by pyrolysis of organic acid salts", Jpn. J. Appl. Phys. 29(3) Mar. 1990 L450-L452.
Jia et al., "$SiO_2$ and $Si_3N_4$ passivation layers on Y-Ba-Cu-O thin films", J. Appl. Phys. 66(1) Jul. 1989 pp. 452-454.

Primary Examiner—Shrive Beck
Assistant Examiner—Roy V. King
Attorney, Agent, or Firm—Choate, Hall & Stewart

[57] ABSTRACT

A superconductor oxide composite is prepared using a press coating technique. The coated layers on various substrates exhibit good adhesion, textured microstructure, and improved $J_c$.

32 Claims, 4 Drawing Sheets

METHOD FOR SYNTHESIS OF HIGH $T_c$ SUPERCONDUCTING MATERIALS BY OXIDATION AND PRESS COATING OF METALLIC PRECURSOR ALLOYS

The government has rights in this invention pursuant to Grant Number DE-FG02-85ER45176.

The United States Government retains rights to this invention based upon funding by the Department of Energy under Contract DE-FG02-85ER-45176.

BACKGROUND OF THE INVENTION

This invention relates to press coating and oxidation of metallic precursor alloy synthesis methods for high $T_c$ superconducting materials.

Bulk, high $T_c$ superconducting oxides suitable for power transmission applications have been synthesized with a number of processing techniques. These techniques include high temperature oxidation of metallic precursor alloys containing metallic constituents of desired superconducting oxides. Such metallic precursors can be made by any metal forming technique depending upon the required superconductor shape including melt spinning, planar flow casting, melt dipping and melt writing. Metallic precursors can contain metals stable through oxidation processing including noble metals such as silver to produce superconducting oxide/metal microcomposites with combined good mechanical and superconducting electrical properties.

SUMMARY OF THE INVENTION

According to one aspect of the invention, high $T_c$ oxide superconductor composites are synthesized by pressure coating a substrate with oxidized metallic precursor alloy.

As an example of the invention, a Bi—Pb—Sr—Ca—Cu—O superconductor composite is synthesized by pressure coating a substrate with an oxidized Bi—Pb—Sr—Ca—Cu/noble metal precursor alloy to produce the Bi—Pb—Sr—Ca—Cu—O/noble metal superconductor composite. Other superconducting systems including Yb—Ba—Cu—O, Y—Ba—Cu—O, and Tl—Ba—Ca—Cu—O can be processed with the press coating method.

In some embodiments, the metallic precursor alloy can be prepared using any metals processing technique including melt spinning, melt dipping, and melt writing. The oxidized metallic precursor alloy can be pressed or rolled onto the substrate at temperatures between 25° C.-800° C. and pressures between 1 and 20 MPa. Substrate materials can be pure metals such as Ag, Au, Pt, Pd, Cu or Ni; stainless steel and nickel alloys; composites including Ag sheets on stainless steel and Ag sheets on Fe, Co, Cu, and Ni alloys, and metal/ceramic composites and ceramics. The Bi—Pb—Sr—Ca—Cu metallic precursor can contain surplus Ca or Cu.

In other embodiments, multiple layers whose thickness and width are controlled by adjusting processing conditions, can be applied to a substrate. Superconducting properties can be optimized by design of suitable heat treatments and multiple press/anneal sequence repetition. Selected mechanical deformation and atmospheric conditions can be combined to enhance superconductor texturing.

In other embodiments, the method can be used to produce high $T_c$ superconductor coatings in a variety of geometries including large or small areas with flat, smooth surfaces and uniform thickness, long wires, and ribbons of selected thickness. Protective coatings can be pressed or rolled onto superconductor coatings using this technique.

Press coating can be used in combination with other superconductor preparation techniques including melt dipping and melt writing methods to further enhance superconducting and mechanical properties. Press coating can be used to join superconductors or fabricate superconductor/normal metal joints. Press coating can also be used in combination with superconducting oxides prepared by other fabrication techniques including powder processing of the individual metal oxides and pyrolysis of metal-organo precursors.

Compared with conventional ceramic processes or the simple metallic precursor oxidation method, the present method offers several advantages. The pressing or rolling treatment produces a dense superconductor coating. The resulting composite has good mechanical properties based on substrate strength and toughness combined with good adhesion between coating and substrate. Combined mechanical deformation and controlled atmosphere annealing produces textured microstructures, characterized by increased critical current density. This method offers considerable flexibility in fabrication of varied geometry composites including wire, narrow or wide ribbon, and small or large area coatings. Coating thickness is uniform (typically 5–200 μm), and can be accurately controlled by the pressing or rolling process.

The product of the oxidation and press coating method is typified by having a textured microstructure with platelike grains of superconductor phase aligned parallel to the substrate plane. The superconductor composite contains no gap between the coating and the substrate.

DESCRIPTION OF THE PREFERRED EMBODIMENT

In a preferred embodiment, Bi—Pb—Sr—Ca—Cu—O/Ag microcomposites were fabricated on Ag, Au, Cu, Pt, Pd, Ni and silver sheet covered stainless steel substrates.

Precursor alloy ribbons were produced by vacuum melting and melt spinning rapid solidification of alloys with nominal compositions (atomic proportions) 1.4 Bi—0.6 Pb—2 Sr—3 Ca—4 Cu with 5, 11, 21 and 36 Ag, corresponding to 35–80 wt. % Ag. Surplus Ca and Cu in the alloys is necessary for obtaining a well developed "2223" superconducting phase. Ribbon thickness and width ranged typically from 50–70 μm and 2 to 3 mm respectively. Ribbons were fully oxidized at 500°–600° C. in 100% $O_2$ for 40 h and annealed at 820° C. in 5% $O_2$+95% Ar for 8 h prior to press coating. Pure Ag sheets (≧99.9% Ag) 0.025–0.25 mm thick, Au, Pt, Pd, Ni, Cu sheets 0.051 mm thick, and stainless steel plates (≃0.3 mm) covered by 0.025 mm thick Ag sheet were used as substrates. Metallic substrates were used as received without further polishing. Substrates were cleaned with dry methanol and distilled water.

Figure 1:
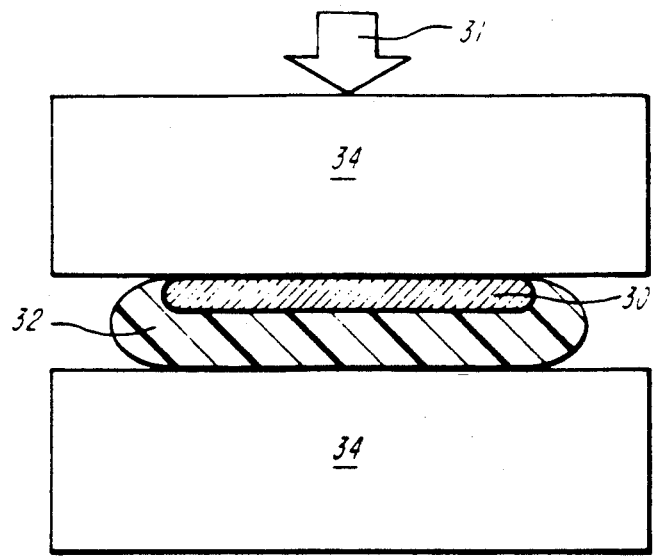
FIG. 1 is a schematic illustration of the press coating process.
Figure 2:
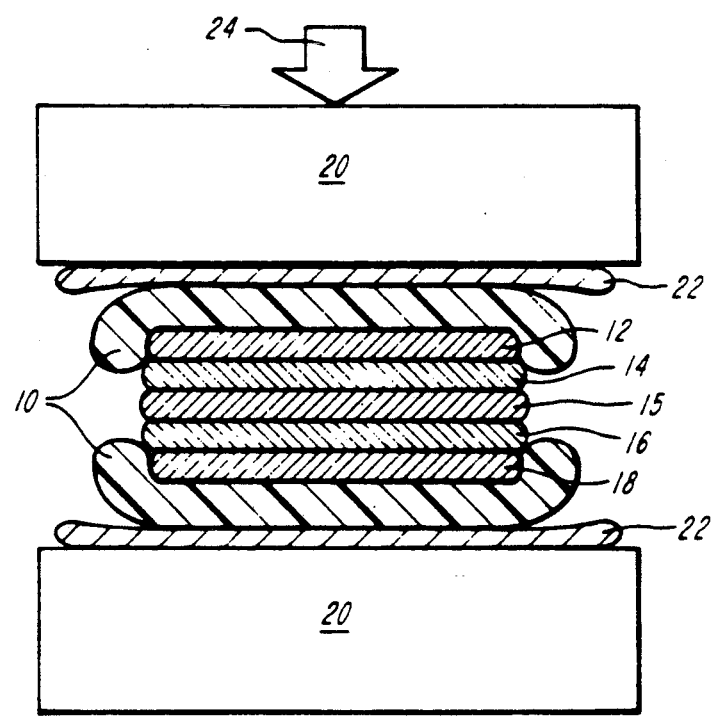
FIG. 2 is a schematic illustration of the press coating of a multi-layered superconductor composite.

Press coating was conducted in a PR-22 Pneumatic Mounting Press under 2–10 MPa pressure at 160° C. Substrates of approximately 3×10 mm dimensions and ribbon were positioned between two steel dies. FIG. 1 shows one piece of ribbon 30 being pressed as indicated by arrow 31 on substrate 32 by dies 34. Alternately, substrates 10 and five layers of ribbon 12, 14, 15, 16, and 18 were positioned between dies 20 with or without lubricating teflon films 22 as shown in FIG. 2. Pressure was applied slowly in the direction given by arrow 24, held for at least 4 minutes, and released.

Press-coated layers were flat, with smooth, shiny surfaces and uniform thicknesses. The degree of adhesion between coating and substrates depends upon substrate properties, applied pressure and processing temperature. Substrate/coating adhesion has been qualitatively classified by visual inspection after cooling, heat treatment and slow bending to approximately 20 degree angles.

Coatings on Ag substrates exhibited the best adhesion, followed by those on Au, Cu and Pd substrates. Coating adhesion on Ag and Au was satisfactory, without spalling or delamination even after subsequent annealing, cooling and bending to 20 degrees. Coatings on Pt, Ni and 304 stainless steel were not adherent. Coatings on Pt, Ni or stainless steels were made adherent by pressing two substrate sheets with teflon films on both sides of the coatings, as shown in FIG. 2.

Pressing caused coating and substrate deformation. The extent of deformation depended on applied pressure, coating and substrate materials, processing temperature and lubrication. A thickness reduction ratio R was used to describe the deformation, as $$R = t_2/t_1$$

where $t_1$ and $t_2$ are the coating thickness before and after pressing, respectively. Table I shows thickness reduction ratio R, applied pressure, coating and substrate materials, and adhesion behavior of coated layers.

As shown in Table I, ratios R vary from 0.30 to 0.45 for $Bi_{1.4}Pb_{0.6}Sr_2Ca_3Cu_4Ag_{21}$ coatings on different substrates subject to identical pressing conditions of 8 MPa without lubrication. Deformation decreased in order for Au, Ag, Cu, Pd, Pt and Ni substrates consistent with the different hardness, ductility and contact friction characteristic of these metals. Lubricant teflon films reduced contact friction and increased deformation by 30–40%, and made behavior of different substrates more uniform.

Adhesion and deformation of coatings also depended on applied pressure. A ≧4 MPa pressure was needed for good coating adhesion on Ag, while pressure ≧10 MPa caused large deformation and sample edge cracking. Coating material composition did not affect the deformation ratio significantly. Coatings with different Ag concentrations exhibited similar thickness after pressing, as shown in Table I.

Press-coated specimens required a second anneal to ensure good superconducting properties. Such anneals removed microcracks created by press/deformation processes which interrupt superconducting grain continuity and adversely affect superconducting properties. Anneals were conducted in 5% $O_2$+95% Ar atmospheres. Deformation processing and annealing were combined to optimize superconducting properties. Resulting superconducting onset temperature, $T_{on}$, zero resistance temperature, $T_{R=0}$, and critical current density, $J_c$, at 77K in zero field are listed in Table II, together with sample pressing and annealing conditions.

$T_c$ and $J_c$ were measured using a standard four-point probe technique. In $J_c$ (77) measurements, a criterion of 1 μv/cm was used to define the critical current $I_c$ and the entire coating cross section was used to calculate the critical current density $J_c(77)$ Special attention was given to current passing through the Ag substrate since Ag is an excellent electrical conductor. At 77K, a pure Ag substrate showed a linear plot of voltage versus current at a scale of 1 mA, with a slope of order 0.1–1 μV/mA, while a superconducting coating on a Ag substrate did not show any voltage until the current reached $I_c$ (approximately 1A), when a sharp transition occurred. Hence, it follows that $I_c$ measurements were not significantly affected by the Ag substrates.

TABLE I

| | Deformation Ratio and Pressed Coating Quality | | | |
|---|---|---|---|---|
| Coating Material | Substrate & Lubricant | Applied Pressure (MPa) | Deformation Ratio $R(= t_2/t_1)$[*1] | Surface Quality & Adhesion[*2] |
| $Bi_{1.4}Pb_{0.6}Sr_2Ca_3Cu_4Ag_{21}$ 600C/48h + 820/8h | Ag/NL[*3] | 8 | 0.35 | adhesion good smooth surface |
| | Au/NL | 8 | 0.30 | adhesion good smooth surface |
| | Cu/NL | 8 | 0.36 | adhesion fair smooth surface |
| | Pd/NL | 8 | 0.38 | adhesion fair smooth surface |
| | Pt/NL | 8 | 0.42 | no adhesion |
| | Ni/NL | 8 | 0.45 | no adhesion |

TABLE I-continued

Deformation Ratio and Pressed Coating Quality

| Coating Material | Substrate & Lubricant | Applied Pressure (MPa) | Deformation Ratio $R(=t_2/t_1)$[*1] | Surface Quality & Adhesion[*2] |
|---|---|---|---|---|
| As above | Ag/TF[*4] | 8 | 0.24 | adhesion good smooth surface |
|  | Cu/TF | 8 | 0.25 | edge cracking |
|  | Ni/TF | 8 | 0.27 | smooth surface |
| As above | Ag/NL | 2 | 0.80 | barely adhered |
|  | Ag/NL | 4 | 0.70 | adhesion fair smooth surface |
|  | Ag/NL | 6 | 0.40 | adhesion good smooth surface |
|  | Ag/NL | 10 | 0.32 | adhesion good smooth surface edge cracking |
| $Bi_{1.4}Pt_{0.6}Sr_2Ca_3Cu_4Ag_3$ 400C/48h + 820/8h | Ag/NL | 8 | 0.33 | adhesion fair surface roughness |
| $Bi_{1.4}Pb_{0.6}Sr_2Ca_3Cu_4Ag_{11}$ 600C/48h + 820/8h | Ag/NL | 8 | 0.35 | adhesion fair smooth surface |
| $Bi_{1.4}Pb_{0.6}Sr_2Ca_3Cu_4Ag_{36}$ 600C/48h + 820/8h | Ag/NL | 8 | 0.35 | adhesion good smooth surface |

[*1]Obtained by pressing the coating with two substrates on both sides; $t_1$ and $t_2$ are the coating thickness before and after pressing.
[*2]Obtained by pressing the coating to a metal substrate.
[*3]NL indicates pressing without lubrication.
[*4]TF indicates pressing with teflon sheets as lubricant.

TABLE II

Pressing, Oxidation and Annealing Conditions With Resultant Superconducting Properties

| Alloy | Substrate | Treatment | $T_{on}/T_{R=0}$ K | $J_c(77)$ A/cm$^2$ |
|---|---|---|---|---|
| $Bi_{1.4}Pb_{0.6}Sr_2$—$Ca_3Cu_4Ag_{21}$ | Ag | melt writing, without pressing, 600/40h + 820/72h | 116/106 | 500 |
|  | Ag | 600/40h + 820/80h + $P_1$[*1] + 820/72h | 116/105 | 800 |
|  | Au | same as above | 114/102 | 400 |
|  | Pt | same as above | 70/— | — |
|  | Pd | same as above | 110/75 | — |
|  | Cu | same as above | 80/72 | — |
|  | Ni | same as above | 76/71 | — |
|  | Ag/S.S.[*2] | same as above | 114/102 | 450 |
|  | Ag | 600/40h + 820/80h + $P_2$[*3] + 820/72h | 116/107 | 1200 |
|  | Ag | 600/40h + 820/80h + $P_2$ + 820/72h + $P_2$ + 800/48h | 116/107 | 2000 |
| $Bi_{1.4}Pb_{0.6}Sr_2$—$Ca_3Cu_4Ag_5$ | Ag | 500/40h + 820/80h + $P_1$ + 830/72h | 116/100 | 500 |
| $Bi_{1.4}Pb_{0.6}Sr_2$—$Ca_3Cu_4Ag_{11}$ | Ag | 500/40h + 820/80h + $P_1$ + 820/72h | 114/104 | 700 |
| $Bi_{1.4}Pb_{0.6}Sr_2$—$Ca_3Cu_4Ag_{36}$ | Ag | 600/40h + 820/80h + $P_1$ + 815/72h | 116/104 | 750 |

[*1]$P_1$ = Pressing with two substrates on both sides at 150–200C, pressure = 8MPa.
[*2]Ag/S.S. = Ag sheets covered stainless steel (304).
[*3]$P_2$ = Pressing with two substrates on both sides at 150–200C, with teflon films between dies and substrates, pressure = 8MPa.

As shown in Table II, the pressed coatings on all the substrates used in the present work exhibited superconductivity after annealing. Those on Ag and Au substrates showed $T_{R=0} \geq 100K$, indicating that a well developed "2223" superconductor phase was formed. The coating on Pd showed $T_{on} = \sim 110K$, but $T_{R=0} = 70-80K$, reflecting co-existence of "2223" and "2212" superconducting phases. Coatings on Cu and Ni showed superconducting transition temperatures of 70–80K, indicating that the superconducting phase was mainly the "2212" phase. Coatings on Pt exhibited superconducting onset temperatures around 70K, with no zero resistance temperatures. Reactions between coatings and certain of these substrates during annealing affected the formation of the superconducting phases. The "2223" phase did not form after coating reaction with Pt, Cu and Ni substrates. The "2212" superconducting phase, however, survived the reactions, probably because of its greater stability.

Substrate/coating reactions can be avoided by covering substrates with Ag sheets. Coatings pressed on Ag covered stainless steel(304) substrates exhibited $T_{R=0} \geq 100K$ and $J_c(77) = 450$ A/cm$^2$, comparable to results with Ag and Au substrates.

Figure 3:
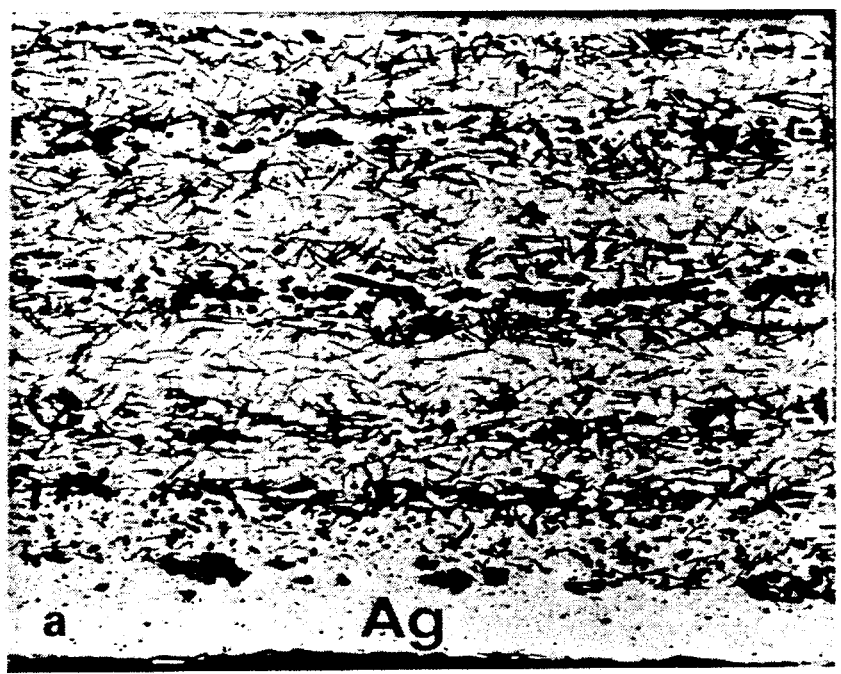
FIG. 3 is an SEM backscattered electron (BSE) micrograph from a polished, longitudinal cross-section of multi-layered $Bi_{1.4}Pb_{0.6}Sr_2Ca_3Cu_4Ag_{21}$ ribbon pressed on a Ag substrate after suitable oxidation and annealing.
Figure 4:
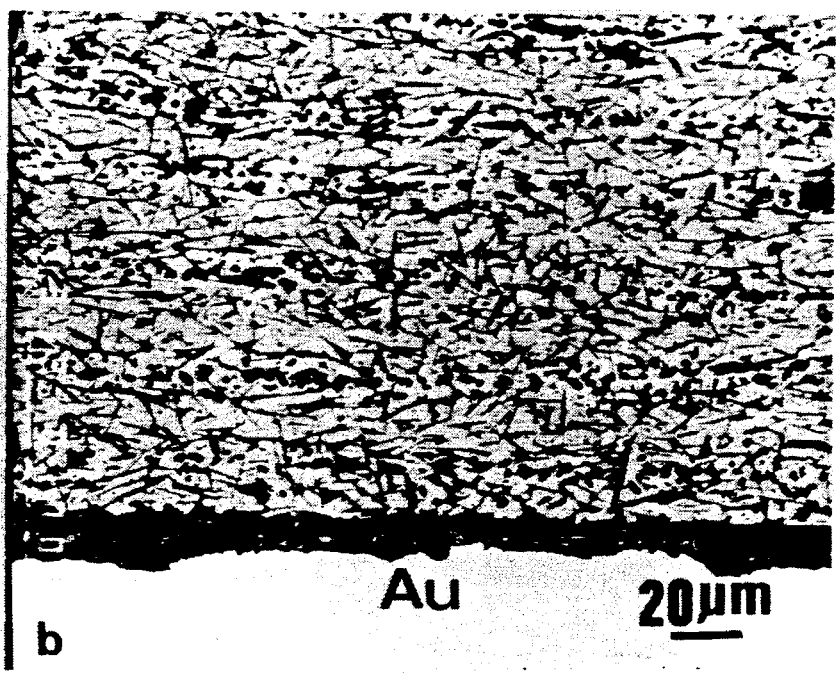
FIG. 4 is an SEM backscattered electron (BSE) micrograph from a polished longitudinal cross-section of a multi-layered $Bi_{1.4}Pb_{0.6}Sr_2Ca_3Cu_4Ag_{21}$ ribbon pressed on a Au substrate after suitable oxidation and annealing.

Microstructural observation and microanalysis were performed with a JEOL Superprobe 733 Microanalyzer equipped with Tracor Northern 5500–5600 WDS and EDS systems. Backscattered electron images (BSE) show contrast between phases of differing chemical composition. FIGS. 3 and 4 show two BSE micrographs of longitudinal cross sectional microstructure of multilayer ribbons of $Bi_{1.4}Pb_{0.6}Sr_2Ca_3Cu_4Ag_{21}$ pressed on Ag and Au substrates. The ribbons were oxidized at 600° C. in 100% $O_2$ for 40 h, then annealed at 820° C. in 5% $O_2$ + 95% Ar for 8 h before pressing. Pressing was conducted at 8 MPa and both sides of the coating were covered by substrates. Specimens were reannealed at 820° C. in 5% $O_2$+95% Ar for 72 h. Substrates are marked to indicate Ag or Au, bright areas are Ag, plate-like, light gray grains are "2223" superconducting phase, and the dark grains are non-superconducting oxides.

As shown in FIG. 3, no gap is visible between the coating and Ag substrate, indicating that there is no coating/substrate reaction. Coating adhesion is very good. In FIG. 4, a dark area close to the Au substrate indicates that some reaction took place at that interface. The affected area was thin (5–10 μm wide), and did not compromise superconducting properties significantly.

Figure 5:
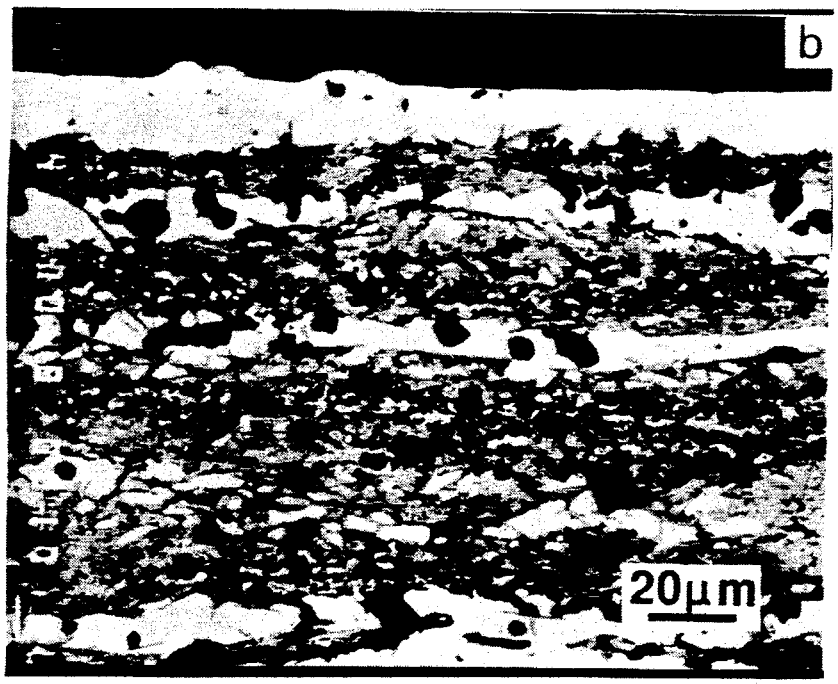
FIG. 5 is an SEM (BSE) cross-section micrograph for an oxidized $Bi_{1.4}Pb_{0.6}Sr_2Ca_3Cu_4Ag_5$ alloy press-coated onto a Ag substrate after suitable oxidation and annealing.
Figure 6:
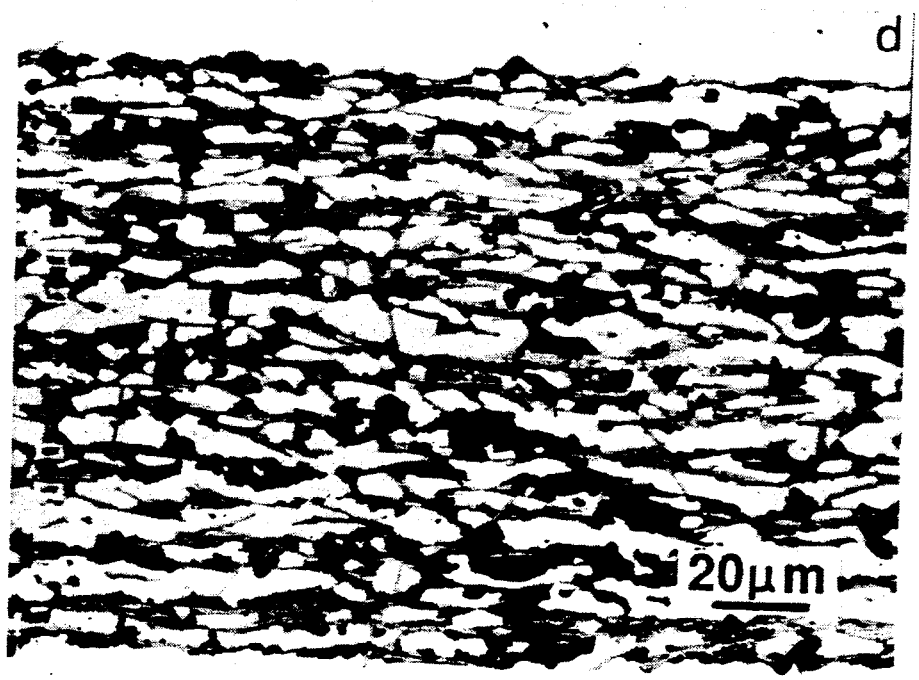
FIG. 6 is an SEM (BSE) cross-section micrograph for a $Bi_{1.4}Pb_{0.6}Sr_2Ca_3Cu_4Ag_{11}$ alloy press-coated onto a Ag substrate after suitable oxidation and annealing.
Figure 7:
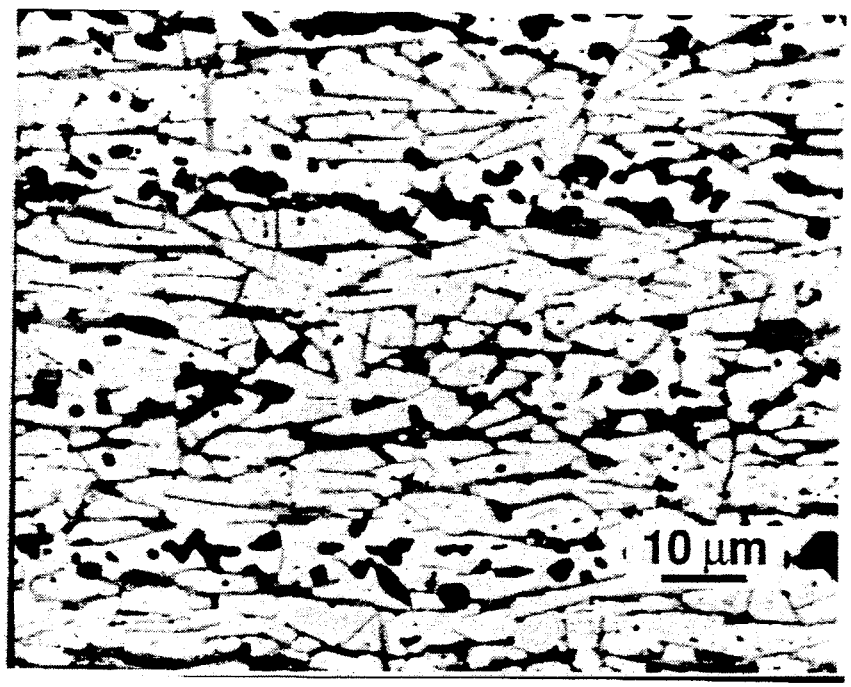
FIG. 7 is an SEM (BSE) micrograph for a $Bi_{1.4}Pb_{0.6}Sr_2Ca_3Cu_4Ag_{36}$ alloy pressed on a Ag substrate after suitable annealing.

FIGS. 5, 6 and 7 are BSE micrographs of $Bi_{1.4}Pb_{0.6}Sr_2Ca_3Cu_4Ag_4$, $Bi_{1.4}Pb_{0.6}Sr_2Ca_3Cu_4Ag_{11}$, and $Bi_{1.4}Pb_{0.6}Sr_2Ca_3Cu_4Ag_{36}$ coatings on Ag substrates oxidized sequentially at 500° C., 550° C. and 600° C. in 100% $O_2$ for 40 h, annealed at 820° C. in 5% $O_2$+95% Ar for 8 h, pressed with 8 MPa and both sides covered with Ag, and reannealed at 820° C. in 5% $O_2$+95% Ar for 72 h. The Ag, "2223" superconducting phase, and non-superconducting phases have contrasts similar to those in FIGS. 3 and 4. The "2223" superconducting phase (platelike, gray grains) was well developed in all three specimens consistent with the $T_c$ and $J_c$ listed in Table II. The microstructure shows apparent texture with Ag and plate-like "2223" grains aligned parallel to the substrate plane, especially for the higher Ag content specimens shown in FIGS. 6 and 7. Texturing produced by pressing deformation enhanced $J_c$.

Figure 8:
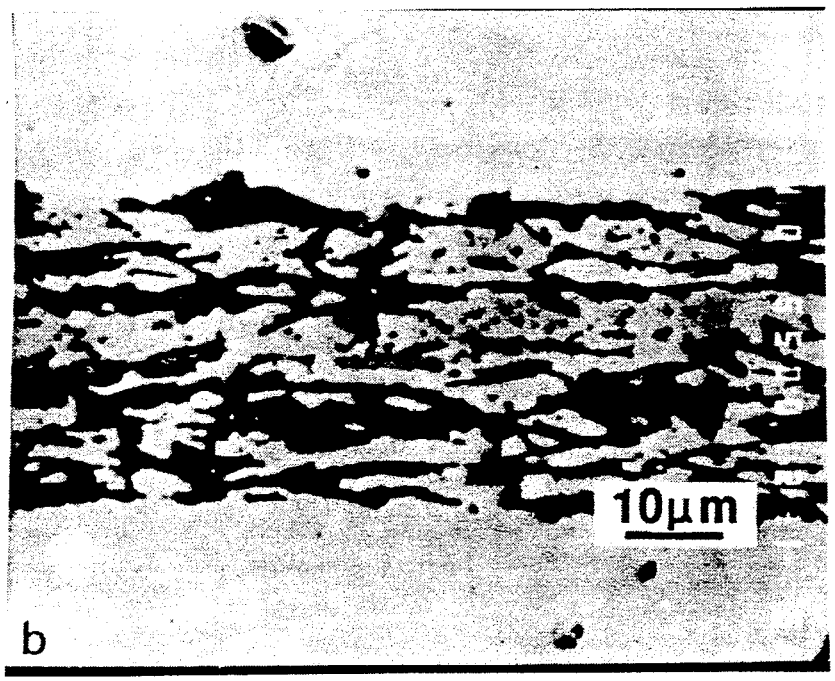
FIG. 8 is an SEM (BSE) micrograph for $Bi_{1.4}Pb_{0.6}Sr_2Ca_3Cu_4Ag_{21}$ alloy pressed on a Ag substrate after suitable oxidation and repeated pressing and annealing.

FIG. 8 is a BSE micrograph for a $Bi_{1.4}Pb_{0.6}Sr_2Ca_3Cu_4Ag_{21}$ coating pressed on a Ag substrate by repeated pressing and annealing. Processing included oxidation at 600° C. for 40 h, annealing at 820° C. for 8 h, pressing at 8 MPa with Ag sheets and teflon films, annealing at 820° C. for 72 h, pressing under the same conditions, and reannealing at 800° C. for 48 h. The "2223" phase exhibited better developed texture than is visible in FIGS. 3, 4, 5, 6 or 7. The coating was thin (approximately 20 μm), and $J_c$ (approximately 2000 A/cm$^2$) was further improved.

What is claimed is:

1. A method for synthesis of oxide superconductor composites comprising:
   preparing a metallic precursor alloy containing metallic constituents of the oxide superconductor and a noble metal;
   oxidizing the precursor alloy;
   press coating the oxidized precursor onto a substrate at a temperature and pressure sufficient to obtain an adherent oxide superconductor composite; and
   reannealing the oxide superconductor composite.

2. A method for synthesis of a Bi—Pb—Sr—Ca—Cu—O superconductor composite comprising:
   preparing a metallic precursor BiPbSrCaCu/noble metal precursor alloy;
   oxidizing the precursor alloy;
   press coating the oxidized precursor onto a substrate at a pressure sufficient to obtain an adherent Bi—Pb—Sr—Ca—Cu—O superconductor composite; and reannealing the Bi—Pb—Sr—Ca—Cu—O superconductor composite.

3. The method of claim 2 wherein the precursor contains surplus Ca and Cu.

4. The method of claim 2 wherein the noble metal is Ag.

5. The method of claim 1 or 2 wherein the precursor alloy is made by any metals processing technique.

6. The method of claim 5 wherein the metals processing technique is a technique selected from the group consisting of melt spinning, melt dipping, and melt writing.

7. The method of claim 1 or 2 wherein said oxidized precursor is pressed or rolled onto the substrate.

8. The method of claim 1 or 2 wherein the oxidized precursor is pressed or rolled on the substrate at temperatures between 25° C. and 800° C.

9. The method of claim 1 or 2 wherein the oxidized precursor is pressed onto the substrate at a pressure between 1 and 20 MPa.

10. The method of claim 1 or 2 wherein the oxidation of said precursor alloy is partial.

11. The method of claim 1 or 2 wherein the oxidation of the precursor alloy is complete.

12. The method of claim 1 or 2 wherein the substrate is a pure metal.

13. The method of claim 12 wherein the metal is a metal selected from the group consisting of Ag, Au, Pt, Cu and Ni.

14. The method of claim 1 or 2 wherein the substrate is an alloy.

15. The method of claim 14 wherein the alloy is an alloy selected from the group consisting of stainless steels and nickel alloys.

16. The method of claim 1 or 2 wherein the substrate is a composite.

17. The method of claim 16 wherein the composite is a composite selected from the group consisting of Ag/stainless steel, Ag/Fe, Ag/Ni, Ag/Co, Ag/Cu, Ag/Fe alloy, Ag/Ni alloy, Ag/Co alloy, and Ag/Cu alloy composites.

18. The method of claim 1 or 2 wherein the substrate is a metal/ceramic composite.

19. The method of claim 1 or 2 wherein the substrate is a ceramic.

20. The method of claim 19 where the ceramic is a metal oxide.

21. The method of claim 1 or 2 wherein the oxidized precursor coatings are applied as multiple layers.

22. The method of claim 21 wherein the thickness and width of layers are controlled by adjusting processing conditions.

23. The method of claim 1 or 2 wherein the superconductor composite is subjected to repeated press/anneal cycles.

24. The method of claim 1 or 2 wherein the combined steps of mechanical deformation during pressure coating and reannealing are used to maximize texture.

25. The method of claim 1 or 2 wherein oxidized precursor alloys are applied to substrates of differing geometries.

26. The method of claim 1 or 2 wherein the superconductor composite is further coated with a protective coating.

27. A method for synthesis of oxide superconductor composites comprising:
   press coating the oxidized precursor/noble metal composite onto a substrate at a temperature and pressure sufficient to obtain an adherent oxide superconductor composite; and
   reannealing the oxide superconductor composite.

28. The method of claim 27 wherein the superconducting oxide is manufactured by a fabrication technique selected from a group consisting of powder processing of the individual metal oxides and pyrolysis of metal-organo precursors.

29. The method of claim 1 or 2 wherein the press coating technique is used to join superconductors and normal metals.

30. The method of claim 1 wherein said superconductor oxide is a superconductor oxide selected from the group consisting of Bi(Pb)—Sr—Ca—Cu—O, Yb—Ba—Cu—O, Y—Ba—Cu—O, and Tl—Ba—Ca—Cu—O.

31. An oxide superconductor composite prepared according to the methods described in claim 1 or 2.

32. A method for synthesis of a textured oxide superconductor composites comprising:
preparing a metallic precursor alloy containing metallic constituents of the oxide superconductor and a noble metal;
oxidizing the precursor alloy;
pressure coating the oxidized precursor onto a substrate at a temperature and pressure sufficient to obtain an adherent oxide superconductor composite;
annealing the oxide superconductor composite; and
subjecting the oxide superconductor composite to repeated pressing and annealing steps in order to optimize texture.

* * * * *

UNITED STATES PATENT AND TRADEMARK OFFICE
CERTIFICATE OF CORRECTION

PATENT NO. : 5,180,707

DATED : January 19, 1993

INVENTOR(S) : Wei Gao et al

It is certified that error appears in the above-identified patent and that said Letters Patent is hereby corrected as shown below:

Column 4, line 45: after "$J_c(77)$" please insert -- . --;

Column 5, Table II: delete " + 820/80h" and insert therefor -- + 820/8h" in entire table;

Column 7, line 16: delete "$Ag_4$" and nsert therefor -- $Ag_5$ --;

Column 7, line 61: after "at a" insert -- temperature and --.

Signed and Sealed this

Fourteenth Day of December, 1993

Attest:

BRUCE LEHMAN

Attesting Officer

Commissioner of Patents and Trademarks